US008647965B2

(12) United States Patent
Sato

(10) Patent No.: US 8,647,965 B2
(45) Date of Patent: Feb. 11, 2014

(54) RADIOGRAPHIC IMAGE DETECTOR, METHOD OF PRODUCING THE SAME, AND PROTECTIVE MEMBER

(75) Inventor: Keiichiro Sato, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 318 days.

(21) Appl. No.: 12/967,184

(22) Filed: Dec. 14, 2010

(65) Prior Publication Data

US 2011/0180890 A1   Jul. 28, 2011

(30) Foreign Application Priority Data

Jan. 28, 2010   (JP) ................................. 2010-017460

(51) Int. Cl.
*H01L 21/30* (2006.01)
*H01L 21/46* (2006.01)
*H01L 27/146* (2006.01)

(52) U.S. Cl.
USPC .. 438/459; 438/692; 257/E21.23; 250/370.09

(58) Field of Classification Search
USPC ......... 257/E21.23; 438/459, 692; 250/370.09
See application file for complete search history.

(56) References Cited

U.S. PATENT DOCUMENTS

| 2005/0072931 | A1 | 4/2005 | Albagli et al. |
| 2007/0054469 | A1* | 3/2007 | Yano et al. .................... 438/459 |
| 2008/0067392 | A1* | 3/2008 | Miyaguchi ............... 250/370.11 |
| 2009/0218560 | A1* | 9/2009 | Flaim et al. ........................ 257/9 |
| 2009/0267173 | A1 | 10/2009 | Takahashi et al. |
| 2010/0006762 | A1* | 1/2010 | Yoshida et al. ............ 250/361 R |
| 2012/0021540 | A1 | 1/2012 | Takahashi et al. |

FOREIGN PATENT DOCUMENTS

| JP | 2000-158611 A | 6/2000 |
| JP | 2001-330677 A | 11/2001 |
| JP | 2005-003866 A | 1/2005 |
| JP | 2005-114731 A | 4/2005 |
| JP | 2005-333042 A | 12/2005 |
| JP | 2005-337962 A | 12/2005 |
| JP | 3768069 B2 | 4/2006 |
| JP | 2007-070432 A | 3/2007 |
| JP | 4138458 B2 | 8/2008 |
| JP | 2009-260323 A | 11/2009 |

OTHER PUBLICATIONS

Office Action dated Sep. 17, 2013 in Japanese Application No. 2010-017460.

* cited by examiner

*Primary Examiner* — Daniel Luke
(74) *Attorney, Agent, or Firm* — Sughrue Mion, PLLC

(57) ABSTRACT

A method of producing a radiographic image detector includes: preparing a thin-film transistor substrate comprising an insulating substrate and a thin-film transistor that is disposed on a surface of the insulating substrate at a first side; attaching, to the thin-film transistor substrate, a protective member comprising a protective member support and an adhesive layer that includes conductive particles and that is disposed on the protective member support, such that the adhesive layer and a surface of the thin-film transistor substrate at the first side contact each other; polishing a surface of the thin-film transistor substrate at a second side opposite to the first side, after the attaching of the protective member; separating and removing the protective member from the thin-film transistor substrate after the polishing; and providing a scintillator layer on a surface of the thin-film transistor substrate at the first side, after the removing of the protective member.

8 Claims, 6 Drawing Sheets

RADIOGRAPHIC IMAGE DETECTOR, METHOD OF PRODUCING THE SAME, AND PROTECTIVE MEMBER

CROSS-REFERENCE TO RELATED APPLICATION

This application is based on and claims priority under 35 USC 119 from Japanese patent Application No. 2010-017460 filed on Jan. 28, 2010, the disclosure of which is incorporated by reference herein.

BACKGROUND OF THE INVENTION

1. Technical Field

The present invention relates to a radiographic image detector, a method of producing the same, and a protective member.

2. Related Art

In recent years, radiographic image detectors that can directly convert radiation to digital data, such as FPDs (Flat Panel Detectors), have come into practical use. The radiographic image detectors have an advantage over conventional imaging plates in that images can be displayed immediately, and the use thereof is rapidly spreading.

Various types of radiographic image detector have been proposed. For example, a radiographic image detector is known in which a scintillator layer made of, for example, CsI:Tl or GOS ($Gd_2O_2S$:Tb) is provided on a thin-film transistor substrate that includes a photoelectric conversion layer and a thin-film transistor (TFT) (specifically, on a surface of the thin-film transistor substrate on which the TFT is provided).

In this radiographic image detector, incident radiation is first converted to a light beam by the scintillator layer, the light beam generated is converted to an electric charge by the photoelectric conversion layer, and the electric charge generated is read through the thin-film transistor, as a result of which a radiographic image is obtained (indirect conversion system).

In recent years, studies have been done on the reduction in the thickness of the thin-film transistor substrate of the radiographic image detector from the viewpoint of, for example, decreasing the weight and thickness of the radiographic image detector and improving the image quality (see, for example, Japanese Patent Application Laid Open (JP-A) No. 2001-330677 and Japanese Patent No. 4138458).

Another known technique related to polishing of the substrate is a method of thinning a semiconductor wafer that includes: attaching the surface of a semiconductor wafer to a support with a thermal-release double-sided bonding sheet or tape having a different thermal release temperature at each side disposed therebetween; polishing the rear surface of the semiconductor wafer in the state in which the support is fixed; and separating the semiconductor wafer having a reduced thickness from the support by heating (see, for example, Japanese Patent No. 3768069).

SUMMARY OF THE INVENTION

However, according to the technique described in JP-A No. 2001-330677, the thin-film transistor substrate is polished only after the radiographic image detector is formed by providing the scintillator layer on the thin-film transistor substrate. Therefore, the light-emission properties of the scintillator may be deteriorated due to water or polishing agents used for polishing. Further, the substrate thickness after polishing may become uneven due to unevenness in the film thickness of the scintillator layer.

Japanese Patent No. 4138458 does not describe any means for reducing the substrate thickness.

According to the technique described in Japanese Patent No. 3768069, when the thermal-release double-sided bonding sheet or the like is peeled from the substrate, delamination charging may occur at the substrate. Therefore, the thin-film transistor may be deteriorated by the delamination charging when the technique described in Japanese Patent No. 3768069 is applied to the method of polishing the radiographic image detector.

The present invention has been made in consideration of the above-described circumstances, and provides the following.

A first aspect of the invention provides a method of producing a radiographic image detector. The method includes:

preparing a thin-film transistor substrate including an insulating substrate and a thin-film transistor that is disposed on a surface of the insulating substrate at a first side;

attaching, to the thin-film transistor substrate, a protective member including a protective member support and an adhesive layer that includes conductive particles and that is disposed on the protective member support, such that the adhesive layer and a surface of the thin-film transistor substrate at the first side contact each other;

polishing a surface of the thin-film transistor substrate at a second side opposite to the first side, after the attaching of the protective member;

separating and removing the protective member from the thin-film transistor substrate after the polishing; and providing a scintillator layer on a surface of the thin-film transistor substrate at the first side, after the removing of the protective member.

In the method of producing a radiographic image detector according to the first aspect, the thin-film transistor substrate is polished before the scintillator layer is provided, rather than after the scintillator layer is provided. Therefore, the substrate after polishing does not have thickness unevenness of the substrate caused by thickness unevenness of the scintillator layer, whereby thickness unevenness of the substrate after polishing is suppressed. Further, deterioration of the light-emission properties of the scintillator layer caused by water or polishing agents used for polishing is suppressed.

In order to polish a thin-film transistor substrate before a scintillator layer is provided, it is necessary to provide a protective member on the thin-film transistor in advance of polishing so as to prevent the thin-film transistor from being scratched during polishing. The protective member is detached and removed after polishing. When the protective member is detached and removed, the thin-film transistor may be deteriorated by delamination charging.

In this regard, in the method of producing a radiographic image detector according to the first aspect of the present invention, an adhesive layer containing conductive particles is arranged between the thin-film transistor substrate and the protective member support. Therefore, when the protective member is detached and removed, delamination charging is suppressed. Thus, deterioration of the thin-film transistor due to delamination charging is suppressed, according to the method of producing a radiographic image detector according to the first aspect.

In the method of producing a radiographic image detector, the conductive particles are preferably carbon particles (second aspect).

In the method of producing a radiographic image detector, the number average particle diameter of the conductive particles is preferably from 0.01 μm to 50 μm (third aspect).

A number average particle diameter within the above range further suppresses delamination charging.

In the method of producing a radiographic image detector, the content of the conductive particles in the adhesive layer is preferably from 0.1% by mass to 40% by mass (fourth aspect).

A content of the conductive particles within the above range further suppresses delamination charging.

In the method of producing a radiographic image detector, the adhesive layer may further contain thermally-expandable particles (fifth aspect).

Inclusion of thermally-expandable particles in the adhesive layer enables the adhesion force of the adhesive to be decreased by heating, thereby reducing the force required for detaching the protective member. As a result, it is possible to reduce the substrate thickness while suppressing substrate cracking.

The method of producing a radiographic image detector may further include adhering a support member to the surface of the thin-film transistor substrate at the polished side (second side), after the polishing but before the removing of the protective member (sixth aspect).

As a result of including this process, the strength of the substrate can be maintained when the protective member is detached, thereby allowing the substrate thickness to be further decreased while suppressing substrate cracking.

In the method of producing a radiographic image detector, the scintillator layer may include a crystal including CsI, or a crystal including $Gd_2O_2S$ and Tb (seventh aspect).

As a result of the inclusion of such a crystal in the scintillator layer, the conversion efficiency from radiation to light beams can be further increased, thereby allowing the S/N ratio (signal-to-noise ratio) of the image to be further improved.

In the method of producing a radiographic image detector, the conductive particles may be contained inside the adhesive layer (eighth aspect), or may be present on a surface of the adhesive layer but not present inside the adhesive layer (ninth aspect). In the ninth aspect, the distribution density of the conductive particles on the surface of the adhesive layer may be from 10 particles/mm² to 1000 particles/mm² (tenth aspect).

An eleventh aspect of the invention provides a radiographic image detector which is produced by the method of producing a radiographic image detector of any one of the first to tenth aspects of the invention, wherein the radiographic image detector detects a radiographic image by allowing radiation to be incident from the second side of the thin-film transistor substrate.

The radiographic image detector of the eleventh aspect is produced by the production method of any one of the first to tenth aspects of the invention, with which deterioration of the thin-film transistor caused by delamination charging is suppressed when detaching and removing the protective member, deterioration in the light-emission properties of the scintillator is suppressed, and thickness unevenness of the substrate after polishing is suppressed. Therefore, image unevenness or image sharpness reduction caused by deterioration of the thin-film transistor, deterioration of the scintillator, or thickness unevenness of the substrate is suppressed.

In the radiographic image detector of the eleventh aspect of the invention, since radiation is incident from the second side (the side on which the thin-film transistor is not provided; hereinafter also referred to as "rear side"), the light-emission position in the scintillator layer is near the thin-film transistor compared to a case in which radiation is incident from the first side at which the thin-film transistor is provided (hereinafter also referred to "front side"). As a result, the sharpness of the resultant radiographic image is high (that is, the resolution of the radiographic image is high), and sensitivity is high.

The radiographic image detector of the eleventh aspect of the invention is produced by the production method of any one of the first to tenth aspects of the invention, with which thickness unevenness of the substrate after polishing can be suppressed. Therefore, unevenness in light detection sensitivity or unevenness in the sharpness of a radiographic image can be suppressed.

A twelfth aspect of the invention provides a protective member which is used in the method of producing a radiographic image detector according to any one of the first to tenth aspects. The protective member includes a protective member support and an adhesive layer that includes conductive particles and that is disposed on the protective member support.

Due to this configuration, deterioration of the thin-film transistor caused by delamination charging can be suppressed when the protective member is detached and removed, deterioration in the light-emission properties of the scintillator can be suppressed, and thickness unevenness of the substrate after polishing can be suppressed.

DETAILED DESCRIPTION

Figure 1:
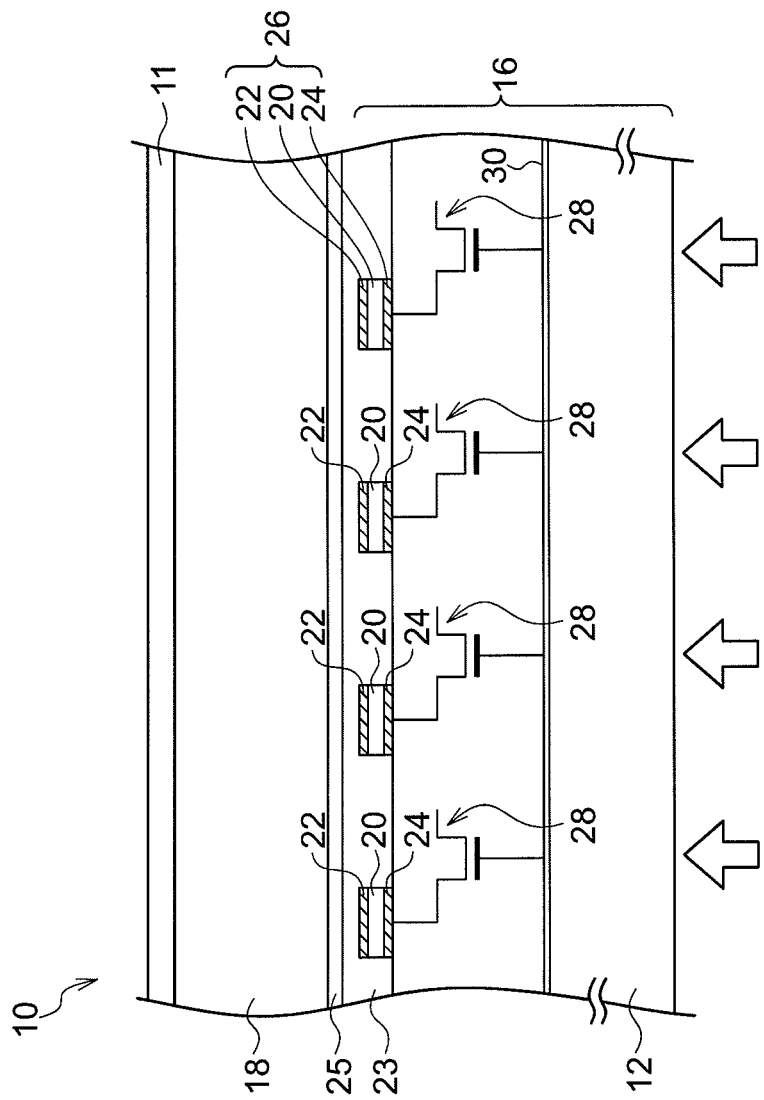
FIG. 1 is a schematic sectional view schematically showing the configuration of an example of the radiographic image detector according to the invention.

The method of producing a radiographic image detector according to the invention includes:

a substrate preparation process of preparing a thin-film transistor substrate including an insulating substrate and a thin-film transistor that is disposed on a surface of the insulating substrate at one side (hereinafter also referred to as "front side");

a protective member attachment process of attaching, to the thin-film transistor substrate, a protective member including a protective member support and an adhesive layer that includes conductive particles and that is disposed on the protective member support, such that the adhesive layer and a surface of the thin-film transistor substrate at the front side (the side at which the thin-film transistor is provided) contact each other;

a polishing process of polishing a surface of the thin-film transistor substrate at the opposite side (the side at which the thin-film transistor is not provided; this side is hereinafter also referred to as "rear side"), after the attaching of the protective member;

a protective member removal process of separating and removing the protective member from the thin-film transistor substrate after the polishing; and a scintillator layer forming process of providing a scintillator layer on a surface of the thin-film transistor substrate at the first side, from which the protective member has been separated and removed, after the removing of the protective member.

A radiographic image detector according to the invention is a radiographic image detector which is produced by the method of producing a radiographic image detector according to the invention and which detects a radiographic image by allowing radiation to be incident from the rear side of the substrate.

A protective member according to the invention is a protective member which is used in the method of producing a radiographic image detector according to the invention, and includes a protective member support and an adhesive layer that contains conductive particles and that is disposed on the protective member support.

Embodiments of the invention are described below with reference to the drawings. Members having substantially the same function and operation are represented by the same reference numeral throughout the drawings, and overlapping descriptions thereof are omitted in some cases.

<<Radiographic Image Detector>>

First, an example of a radiographic image detector produced by the method of producing a radiographic image detector according to the invention is described in the following.

FIG. 1 is a schematic sectional view schematically showing the configuration of an example of the radiographic image detector.

Figure 2:
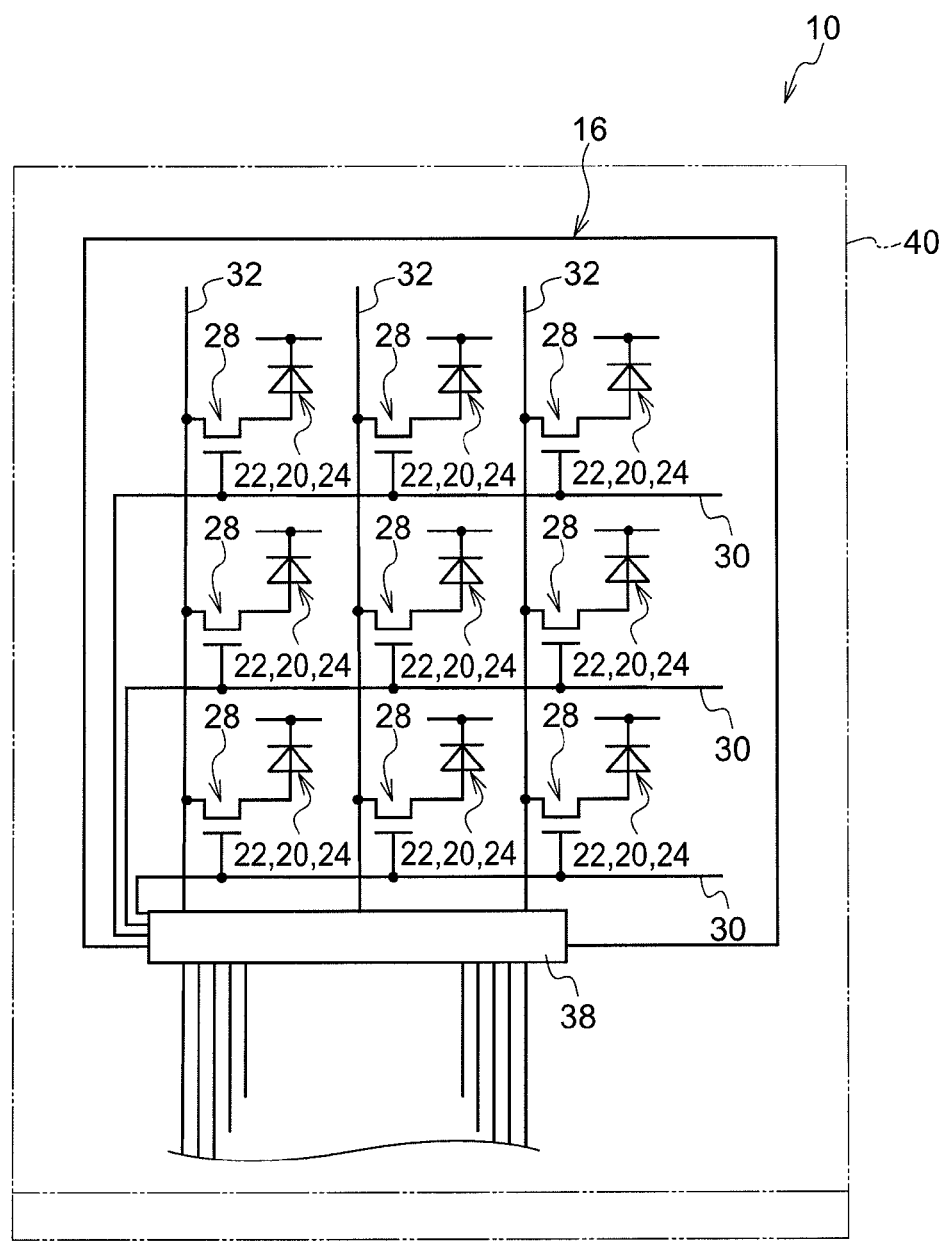
FIG. 2 is a schematic plan view schematically showing the configuration of an example of the radiographic image detector according to the invention.

FIG. 2 is a schematic plan view schematically showing the configuration of the example of the radiographic image detector.

As shown in FIG. 1, a radiographic image detector 10 of this example includes a TFT substrate (thin-film transistor substrate) 16, and a scintillator layer 18 which serves as a radiation conversion layer capable of converting incident radiation to light beams.

The TFT substrate 16 includes an insulating substrate 12, and a switch element 28, a flattening layer 23, and a photoelectric conversion layer 26, which are provided on the insulating substrate 12; the switch element 28 is constituted by a thin-film transistor (TFT), the photoelectric conversion layer 26 is electrically connected to the switch element 28, and the flattening layer 23 is provided to cover the switch element 28 and the photoelectric conversion layer 26.

The scintillator layer 18 is provided on a surface of a scintillator layer support 11, and a surface of the scintillator layer 18 that is opposite to the surface contacting the scintillator layer support 11 is bonded to the TFT substrate 16 with a bonding layer 25 disposed between the scintillator layer 18 and the TFT substrate 16.

The material for the scintillator layer 18 is not particularly limited, and examples thereof include a crystal containing CsI, a crystal containing NaI, and a crystal containing $Gd_2O_2S$ and Tb.

Specific examples of the material for the scintillator layer 18 include a crystal formed from CsI:Tl (thallium-activated cesium iodide), a crystal formed from CsI:Na (sodium-activated cesium iodide), a crystal formed from GOS ($Gd_2O_2S$:Tb), and a crystal formed from NaI:Tl (thallium-activated sodium iodide).

Of these, a crystal containing CsI (such as CsI:Tl or CsI:Na) or a crystal (GOS) containing $Gd_2O_2S$ and Tb is preferable from the viewpoint of conversion efficiency from radiation to light beams.

Of these, a crystal (CsI:Tl) containing CsI and Tl or a crystal (GOS) containing $Gd_2O_2S$ and Tb is preferable from the viewpoints of the matching of the light-emission spectrum and the spectral sensitivity maximum (around 550 nm) of an a-Si photodiode and stronger suppression of deterioration over time caused by humidity.

Use of a crystal containing CsI and Tl results in higher effect in terms of suppressing a decrease in image sharpness (MTF).

The form of the crystal (particularly, a crystal containing CsI) of the scintillator layer 18 is not particularly limited, and a columnar crystal is preferable from the viewpoint of image sharpness.

When radiation is irradiated from the rear side of the TFT substrate, a preferred configuration of the scintillator layer 18 is a configuration in which a portion of the scintillator layer 18 at a side closer to the TFT substrate 16 includes a columnar crystal, and a portion of the scintillator layer 18 at a side farther from the TFT substrate 16 includes a non-columnar crystal.

In this configuration, columnar crystals, which emit light at high efficiently, in the columnar crystal portion exist near the TFT substrate 16, and the gap between columnar crystals serve as a light guide, thereby suppressing light diffusion and blurring of the image, and improving image sharpness. Further, light that has reached the deep portion is reflected at the portion including a non-columnar crystal, thereby improving the efficiency of the detection of light emission.

The radiographic image detector and the production method thereof according to the present embodiment produces an effect in that the deliquescence or dissolution of columnar crystals due to the polishing liquid can be prevented even when the scintillator layer 18 includes a columnar crystal.

The scintillator layer support 11 may be selected, as appropriate, from a carbon plate, CFRP (carbon fiber reinforced plastic), a glass plate, a quartz substrate, a sapphire substrate, a sheet of metal such as iron, tin, chromium, or aluminum, or the like. The scintillator layer support 11 is not particularly limited thereto as long as a crystal portion that forms the scintillator layer 18 can be formed on a surface thereof.

The insulating substrate 12 may be selected from, for example, glass substrates, various ceramic substrates, and resin substrates. However, the insulating substrate 12 is not limited to these materials.

In the radiographic image detector 10, the photoelectric conversion layer 26 is disposed between the scintillator layer 18 and the insulating substrate 12. The photoelectric conversion layer 26 is electrically connected to the switch element 28.

In the radiographic image detector 10, light generated by conversion by the scintillator layer 18 is converted to an electric charge by the photoelectric conversion layer 26, and the generated electric charge is read by the switch element 28.

The photoelectric conversion layer 26 is a laminated body having a photoconductive layer 20, a bias electrode 22, and an electric charge collection electrode 24. The photoconductive layer 20 generates an electric charge when receiving incident light generated by conversion by the scintillator layer 18. The bias electrode 22 is disposed at the scintillator layer 18 side of the photoconductive layer 20, and applies a bias voltage to the photoconductive layer 20. The electric charge collection electrode 24 is disposed on the insulating substrate 12 side of the photoconductive layer 20, and collects the electric charge generated by the photoconductive layer 20.

The electric charge collection electrodes 24 are arranged two-dimensionally on the TFT substrate 16, and, as shown in FIG. 2, the switch elements 28 are arranged two-dimensionally on the insulating substrate 12 so as to correspond to the electric charge collection electrodes 24.

Plural gate lines 30 and plural signal lines (data lines) 32 are provided on the TFT substrate 16. The plural gate lines 30 extend in a fixed direction (row direction) and serves to turn on/off the individual switch elements 28. The plural signal lines (data lines) 32 extend in a direction (column direction) perpendicular to the gate lines 30, and read electric charges via switch elements 28 in the ON state.

In the TFT substrate 16, a flattening layer 23 is provided at the upper side of the switch elements 28 and the photoelectric conversion layer 26 (i.e., at the side farther than the switch elements 28 and the photoelectric conversion layers 26 when viewed from the insulating substrate 12) so as to cover the switch elements 28 and the photoelectric conversion layers 26, and to flatten the surface of the TFT substrate 16.

A bonding layer 25 is provided between the scintillator layer 18 and the flattening layer 23 so as to bond the scintillator layer 18 to the TFT substrate 16.

In the radiographic image detector 10, however, the flattening layer 23 and the bonding layer 25 are not essential, and at least one of the flattening layer 23 or the bonding layer 25 may be omitted.

The TFT substrate 16 has a quadrilateral shape having four sides at the periphery in plan view. Specifically, the TFT substrate 16 has a rectangular shape.

As shown in FIG. 2, the TFT substrate 16 is disposed on a support 40. Here, a side of the TFT substrate 16 at which the switch elements 28 are provided is the side that is farther from the support 40, and a side of the TFT substrate at which the switch elements 28 are not provided is the side that is closer to the support 40. The illustration of the support 40 is omitted in FIG. 1.

At the peripheral portion of the TFT substrate 16 in plan view, a connection terminal 38 to which the gate lines 30 and the signal lines 32 are connected is provided at one side of the TFT substrate 16. As shown in FIG. 2, the connection terminal 38 is connected to a circuit board through a connection circuit. The circuit board includes a gate line driver (not shown) as an external circuit and a signal processing section (not shown) as an external circuit.

The switch elements 28 are sequentially turned on row by row in accordance with the signals supplied from the gate line driver through the gate lines 30, and the electric charges read by switch elements 28 in the ON-state is transmitted through the signal lines 32 as electric charge signals and are input to the signal processing section. Thus, the electric charges are sequentially read row by row, as a result of which a two-dimensional radiographic image can be obtained.

Although the gate lines 30 and the signal lines 32 extend to orthogonally intersect each other in the above-described configuration, another configuration may be adopted in which the gate lines 30 and the signal lines 32 extend in parallel, and the gate lines 30 and the signal lines 32 are connected to a connection terminal provided at one side at the periphery of the TFT substrate 16.

The above-described radiographic image detector 10 is an indirect-conversion radiographic image detector which first converts radiation to light beams and further converts the light beams to electric charges so as to perform radiographic detection.

Next, the direction in which radiation is incident on the scintillator layer 18 in the radiographic image detector 10 is explained below.

In the radiographic image detector 10, the direction in which radiation is incident may be, as indicated by an arrow in FIG. 1, such that incident radiation coming from the TFT substrate 16 side (more specifically, the insulating substrate 12 side) passes through the TFT substrate 16 and are incident on the scintillator layer 18 (this case is hereinafter referred to as "when radiation is incident from the rear side"), or the direction may be the opposite such that radiation is incident from the scintillator layer 18 side (this case is hereinafter referred to as "when radiation is incident from the front side").

In a case in which radiation is irradiated from the rear side, a radiographic image obtained by imaging has high resolution (i.e., sharpness) and sensitivity since the light-emission position in the scintillator layer 18 is closer to the photoconductive layer 20 than in a case in which radiation is irradiated from the front side.

However, in a radiographic image detector in which radiation is irradiated from the rear side, it is generally necessary that radiation pass through the TFT substrate 16. Therefore, when there is unevenness in the thickness of the TFT substrate, the amount of radiation reaching the scintillator may be uneven, and sensitivity or sharpness is also likely to be uneven.

In contrast, since the radiographic image detector of the present embodiment is obtained by the method of producing a radiographic image detector according to the present embodiment, the thickness of the insulating substrate 12 of the radiographic image detector of the present embodiment is reduced by polishing of a surface thereof at the rear side, and unevenness in the substrate thickness after polishing is suppressed.

Therefore, unevenness in sensitivity or sharpness is suppressed particularly effectively in a case in which the radiographic image detector of the present embodiment adopts a configuration in which radiation is irradiated from the rear side.

Since the radiographic image detector described above detects a radiographic image with high sensitivity and high resolution, the radiographic image detector can be integrated into various apparatuses, including X-ray imaging apparatuses for medical diagnosis such as mammography, that are required to detect a sharp image with a small radiation dose. For example, the radiographic image detector may be used as industrial X-ray imaging apparatuses for nondestructive tests, or as detection apparatuses for particle rays ($\alpha$-ray, $\beta$-ray, $\gamma$-ray) other than electromagnetic waves. The application range of the radiographic image detector is wide.

<<Method of Producing Radiographic Image Detector>>

Next, embodiments of the method of producing a radiographic image detector according to the invention are described below.

FIGS. 3A to 3E are schematic process views showing a first embodiment of the method of producing a radiographic image detector according to the invention.

FIGS. 4A to 4F are schematic process views showing a second embodiment of the method of producing a radiographic image detector according to the invention.

FIGS. 5 to 8 show embodiments of the protective member according to the invention.

Individual processes in the method of producing a radiographic image detector of the present embodiment are described below.

<Substrate Preparation Process>

Figure 3A:
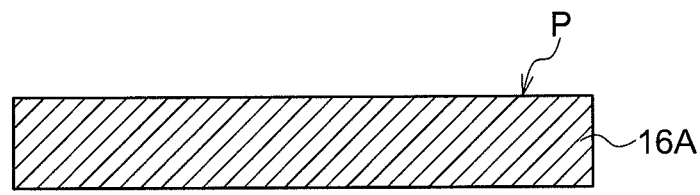
FIGS. 3A to 3E are schematic process views showing a first embodiment of the method of producing a radiographic image detector according to the invention.

The substrate preparation process is a process of preparing a TFT substrate 16A including a switch element and a photoelectric conversion layer (not shown) that are disposed at the front side at which the surface P is located (FIG. 3A).

The details of the TFT substrate 16A are the same as the TFT substrate 16 described with reference to FIGS. 1 and 2.

The TFT substrate 16A may be a TFT substrate that has been prepared in advance, or a TFT substrate that is produced for the production of each radiographic image detector by forming at least one switch element and a photoelectric conversion layer on an insulating substrate.

The substrate thickness (the substrate thickness before polishing) is not particularly limited; the substrate thickness is preferably from 0.3 mm to 3.0 mm, and more preferably from 0.5 mm to 2.0 mm, from the viewpoint of suppressing substrate cracking and improving polishing efficiency.

<Protective Member Attachment Process>

Figure 3B:
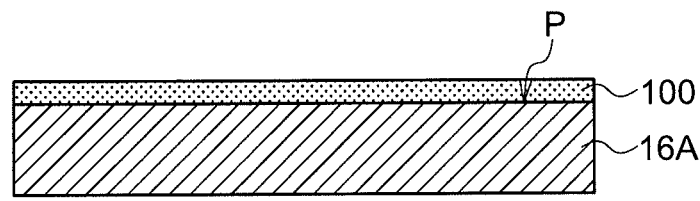

The protective member attachment process is a process of attaching a protective member 100 to the front surface P of the TFT substrate 16A (FIG. 3B).

Figure 5:
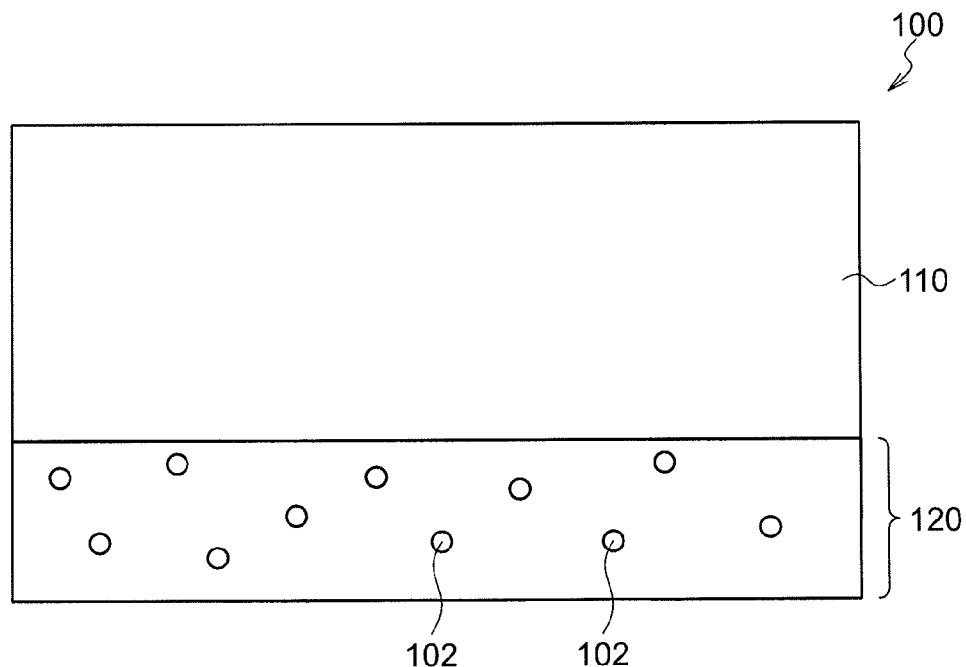
FIG. 5 is a schematic sectional view showing an example of the protective member according to the invention.

FIG. 5 is an enlarged schematic sectional view of the protective member 100 of FIG. 3B.

In the present embodiment, a protective member 200, a protective member 300, or a protective member 400 described below (FIGS. 6 to 8) may be used instead of the protective member 100 of FIG. 3B.

As shown in FIG. 5, the protective member 100 includes a protective member support (for example, a resin film) 110 and an adhesive layer 120 that contains conductive particles 102 and that is provided on the protective member support 110.

In the protective member attachment process, the protective member 100 is attached to the front surface P of the TFT substrate 16A such that the adhesive layer 120 and the front surface P of the TFT substrate 16A contact each other.

Examples of methods of attaching the protective member 100 include a method of attaching the protective member 100 by using a laminator such as a roll laminator or a vacuum laminator.

(Protective Member)

In the following, the protective member in the present embodiment is described in more detail with reference to FIGS. 5 to 8.

Figure 6:
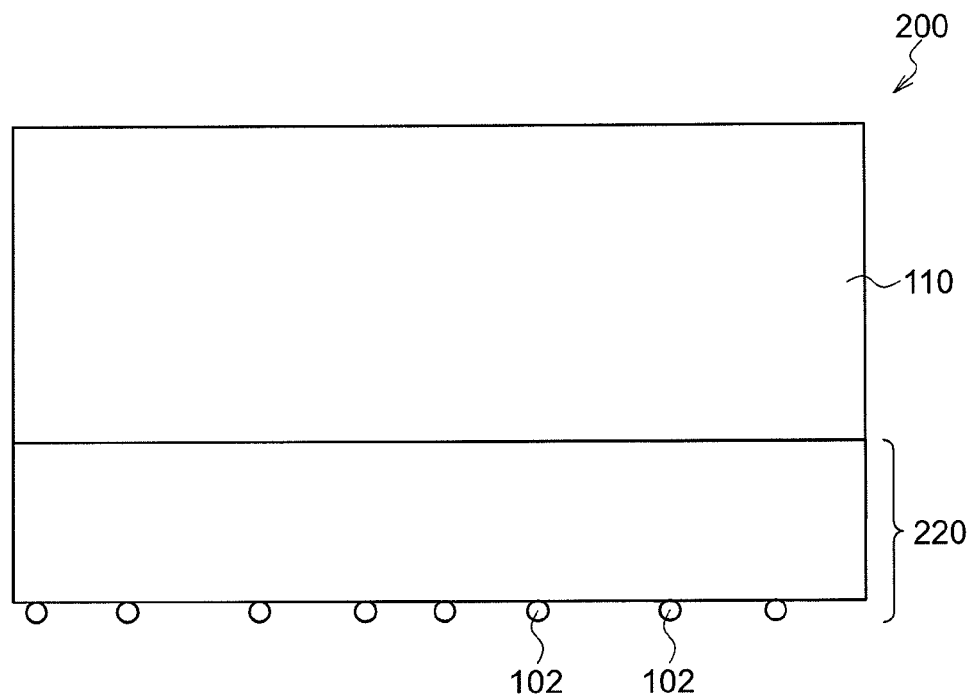
FIG. 6 is a schematic sectional view showing another example of the protective member according to the invention.
Figure 7:
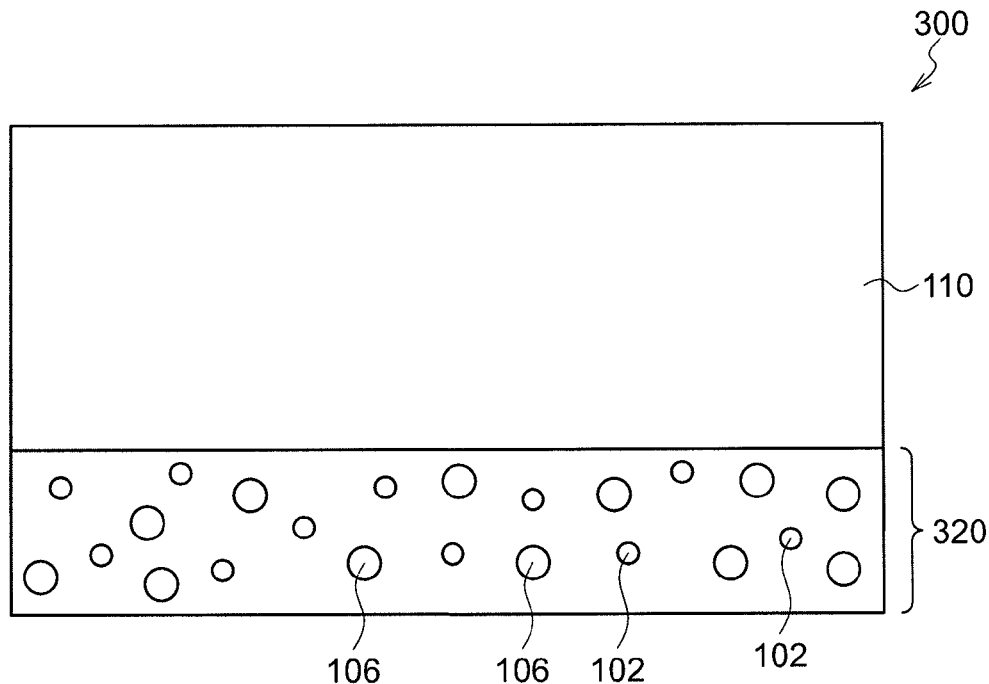
FIG. 7 is a schematic sectional view showing another example of the protective member according to the invention.
Figure 8:
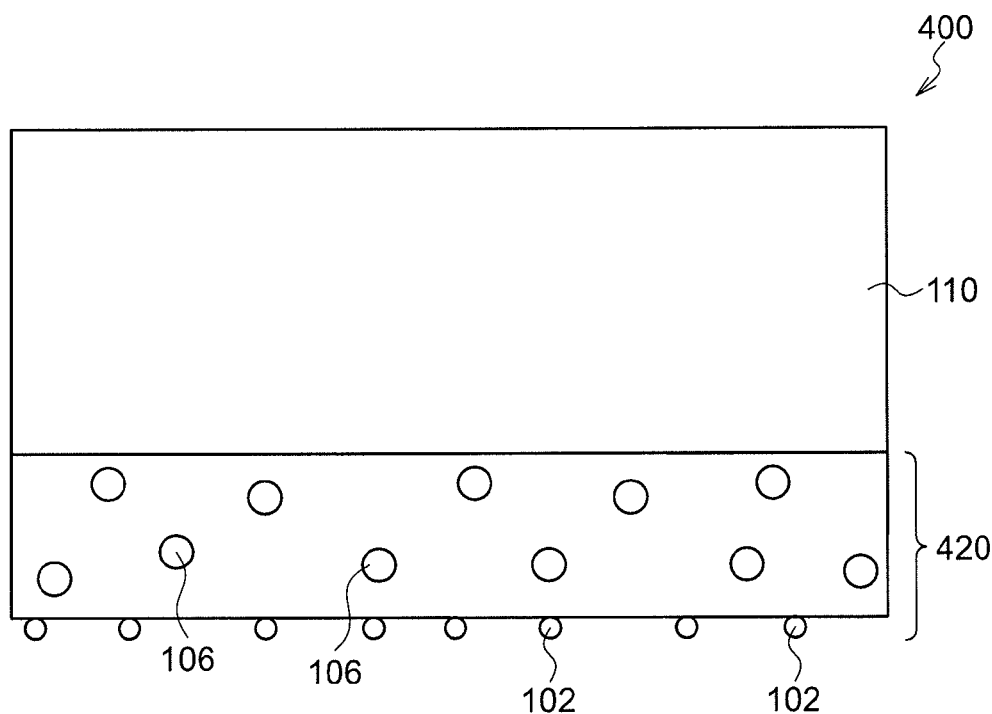
FIG. 8 is a schematic sectional view showing another example of the protective member according to the invention.

The following description focuses on the protective member 100 of FIG. 5, and, in the explanation of the protective member 200, the protective member 300, and the protective member 400 of FIGS. 6 to 8, the same element as an element in the protective member 100 of FIG. 5 is represented by the same reference numeral as that in the protective member 100, and description thereof is omitted.

The protective member support 110 (support for a protective member) in the protective member 100 may be, for example, a resin film.

Examples of the resin of the resin film include, but are not limited to, polyesters, polyolefins, and polyvinyl chloride.

The thickness of the protective member support 110 (for example, a resin film) in the protective member 100 is preferably from 25 μm to 1000 μm, and more preferably from 50 μm to 500 μm.

When the thickness is equal to or more than 25 μm, handling of the laminated body of the protective member and the TFT substrate after polishing of the rear surface of the TFT substrate is easier.

When the thickness is equal to or less than 1000 μm, deformation of the laminated body of the protective member and the TFT substrate can be more effectively suppressed, and unevenness in the thickness of the TFT substrate after polishing and breakage of the TFT substrate during the polishing process can be more effectively suppressed.

The base material (matrix) of the adhesive layer 120 may be, for example, a conventional adhesive, and examples of adhesive materials that can be used include pressure-sensitive adhesives, UV-curable pressure-sensitive adhesives, and thermosetting adhesives.

Examples of pressure-sensitive adhesives include rubber-based pressure-sensitive adhesives in which a rubber-based polymer such as natural rubber, polyisobutylene rubber, styrene-butadiene rubber, styrene-isoprene-styrene block copolymer rubber, regenerated rubber, butyl rubber, polyisobutylene rubber, or NBR is used as a base polymer; silicon-based pressure-sensitive adhesives; and acrylic pressure-sensitive adhesives in which an acrylic polymer formed from an alkyl ester of acrylic acid or methacrylic acid is used as a base polymer. The base material may consist of one component, or two or more components.

The adhesive layer 120 includes conductive particles 102.

The conductive particles 102 may be present inside the adhesive layer as in the case of the adhesive layers 120 and 320 shown in FIGS. 5 and 7, or may be present on the surface of the adhesive layer as in the case of the adhesive layers 220 and 420 shown in FIGS. 6 and 8. Alternatively, the conductive particles may be present at both the inside of the adhesive layer and the surface of the adhesive layer.

When the conductive particles 102 are present inside the adhesive layer as shown in FIGS. 5 and 7, the content of the conductive particles 102 in the adhesive layer is not particularly limited, and the content of the conductive particles 102 is preferably from 0.1% by mass to 40% by mass, and more preferably, from 5% by mass to 30% by mass, relative to the total solids content of the adhesive layer.

When the content is equal to or higher than 0.1% by mass, higher conductivity can be imparted to the adhesive, and delamination charging can be more effectively suppressed when separating the protective member from the TFT substrate.

When the content is equal to or lower than 40% by mass, a decrease of the adhesion force of an adhesive can be further suppressed, and detachment of the protective member during polishing can be more effectively suppressed.

When the conductive particles 102 are present on the surface of the adhesive layer as shown in FIGS. 6 and 8, the density of the conductive particles 102 on the surface of the adhesive layer is preferably from 10 particles/mm$^2$ to 1000 particles/mm$^2$, and more preferably from 100 particles/mm$^2$ to 700 particles/mm$^2$.

When the density is equal to or more than 10 particles/mm$^2$, higher conductivity can be imparted to the adhesive, and delamination charging can be more effectively suppressed when separating the protective member from the TFT substrate.

When the density is equal to or less than 1000 particles/mm$^2$, a decrease in the adhesion force of the adhesive can be more effectively suppressed, and detachment of the protective member during polishing can be more effectively suppressed.

The shape of the conductive particles 102 is not particularly limited. The shape of the conductive particles 102 is preferably substantially spherical, from the viewpoints of leveling the difference in height between semiconductor devices formed on the substrate surface and preventing the conductive particles from damaging the semiconductor devices.

The number average particle diameter of the conductive particles 102 is preferably from 0.01 µm to 50 µm, and more preferably from 1 µm to 30 µm.

When the number average particle diameter is equal to or more than 0.01 µm, aggregation of the particles in the adhesive layer can be further suppressed, and higher conductivity can be obtained.

When the number average particle diameter is equal to or less than 50 µm, the jags of the particles are further prevented from appearing on the surface of the adhesive layer, damage to the semiconductor devices is further suppressed, and the difference in height between semiconductor devices can be leveled more easily. A smaller number average particle diameter is more effective in terms of suppressing unevenness in the substrate thickness.

Specific examples of the conductive particles 102 include carbon particles, metal particles (the scope of which includes metal compound particles such as metal oxide particles, as well as metal particles such as copper particles), and conductive organic compound particles.

Of these, carbon particles are preferable from the viewpoint of the cost and the ease of a process of incorporating the particles into the adhesive layer.

In the present embodiment, the adhesive layer may contain thermally-expandable particles 106, as in the cases of the adhesive layers 320 and 420 shown in FIGS. 7 and 8.

The thermally-expandable particles 106 may be, for example, particles in which a material that easily evaporates and expands by heating, such as isobutane, propane, or pentane, is encapsulated by an elastic shell (for example, microcapsule particles). The shell is usually formed from a thermoplastic material, a thermofusible material, a material which ruptures by thermal expansion, or the like. Examples of the material for forming the shell include a vinylidene chloride-acrylonitrile copolymer, polyvinyl alcohol, polyvinyl butyral, polymethyl methacrylate, polyacrylonitrile, polyvinylidene chloride, and polysulphone. The thermally-expandable particles can be produced by a common method, such as a coacervation method or an interfacial polymerization method. The thermally-expandable particles may be a commercial product such as MATSUMOTO MICROSPHERE (tradename, manufactured by Matsumoto Yushi-Seiyaku Co., Ltd.).

The average particle diameter of the thermally-expandable particles 106 is generally approximately from 1 to 80 µm, and preferably approximately from 3 to 50 µm, from the viewpoint of dispersibility, thin layer formation properties, or the like. The thermally-expandable particles preferably have adequate strength for avoiding rupture until the volume expansion rate increases five-fold or more, particularly ten-fold or more, in order to efficiently decrease the adhesion force of the adhesive-containing adhesive layer by heat treatment.

When thermally-expandable particles that rupture at a low expansion rate, or when a thermal expansion agent that is not microcapsulated is used, favorable release properties are less likely to be obtained because, for example, the adhesion area between the adhesive layer and the support is not sufficiently reduced.

The amount of the thermally-expandable particles to be used varies with the type thereof, and is, for example, from 10 to 200 parts by mass, and preferably from 20 to 125 parts by mass, relative to 100 parts by mass of the base material of the adhesive layer.

When the amount of the thermally-expandable particles is equal to or more than 10 parts by mass, the adhesion force after heat treatment can be further decreased. When the amount of the thermally-expandable particles is equal to or less than 200 parts by mass, cohesive failure due to thermally-expandable particles in the adhesive layer and interface failure between the protective member support and the adhesive layer can be more effectively suppressed.

In addition to the base material (adhesive), conductive particles, and optional thermally-expandable particles, the adhesive layer in the invention may further include appropriate additives, such as cross-linking agents (such as isocyanate cross-linking agents and epoxy cross-linking agents), tackifiers (such as rosin derivative resins, polyterpene resins, petroleum resins, and oil-soluble phenol resins), plasticizers, fillers, antioxidants, and surfactants.

The thickness of the adhesive layer in the invention is not particularly limited, and is preferably from 1 µm to 30 µm, and more preferably from 2 µm to 20 µm, from the viewpoint of exerting the effects of the invention more effectively.

The adhesive layer may be formed using an appropriate method, such as a method including applying a coating liquid that contains a base material and conductive particles and optionally further contains thermally-expandable particles, additives, solvents, and the like directly onto the protective member support 110, and bonding the resultant coating layer to the protective member support by applying a pressure through a release liner, or a method including applying the above coating liquid onto an appropriate release liner (a release paper or the like) so as to form a thermally-expandable adhesive layer, and transferring the resultant thermally-expandable adhesive layer to the protective member support 110 by press-bonding.

The protective member may have a configuration in which conductive particles are added to the thermally-releasable adhesive sheet described in, for example, JP-A No. 2003-292916.

The protective member may alternatively be a member obtained by scattering conductive particles on the surface of the adhesive layer of a commercial product such as "REVALPHA" (tradename) manufactured by Nitto Denko Corporation.

<Polishing Process>

Figure 3C:
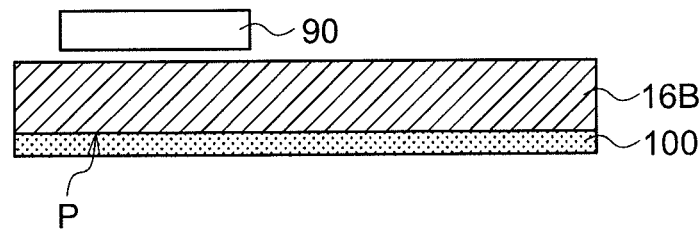

After the protective member attachment process, the polishing process is conducted whereby the rear surface of the TFT substrate 16A (the surface on which the TFT is not provided) is polished by, for example, a polishing pad 90 (FIG. 3C).

Figure 3D:
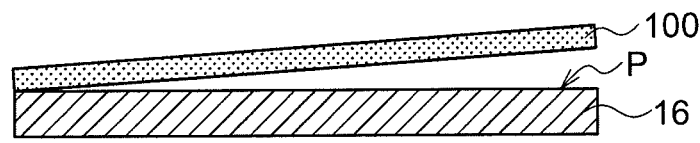
Figure 3E:
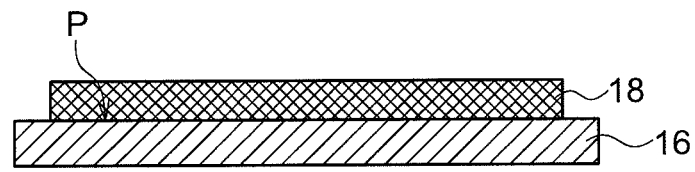

In FIG. 3C, the TFT substrate during the polishing process is designated by reference numeral "16B", and in FIGS. 3D and 3E, the TFT substrate after the polishing process has been completed is designated by reference numeral "16".

Polishing can be performed by, for example, a known chemical mechanical polishing (CMP) process.

Specifically, for example, the surface of the polishing pad 90 is dipped in a polishing liquid, the polishing pad 90 and the rear surface of the TFT substrate 16B are contacted with each other at a predetermined pressure (polishing pressure), and at least one of the polishing pad 90 or the TFT substrate 16B is rotated. Thus, the rear surface of the TFT substrate 16B is polished by the resultant mechanical friction.

The polishing liquid for use in CMP contains, for example, abrasive grains (such as $CeO_2$, $Al_2O_3$, or $SiO_2$ grains) and an oxidant (such as hydrogen peroxide or persulfuric acid). When polishing is conducted using such a polishing liquid, the metal surface is oxidized by the oxidant, and the resultant oxidized film is removed by the abrasive grains.

The thickness of the TFT substrate 16 after polishing is preferably from 0.05 mm to 0.5 mm, and more preferably from 0.1 mm to 0.3 mm.

<Protective Member Removal Process>

The protective member removal process is a process of separating and removing the protective member 100 from the polished TFT substrate 16 (FIG. 3D).

In general, when the protective member is separated and removed, delamination charging may occur at the substrate, and the TFT on the substrate may be damaged due to the delamination charging.

In contrast, in the invention, since the adhesive layer contains conductive particles, delamination charging is suppressed, and damage to the TFT due to delamination charging is suppressed.

The method of separating and removing the protective member may be, for example, a method of separating the protective member from the TFT substrate at a constant speed by using a dedicated apparatus.

<Scintillator Layer Forming Process>

The scintillator layer forming process is a process of forming the scintillator layer 18 on a surface (front surface P) of the TFT substrate 16 from which the protective member 100 has been removed (FIG. 3E).

The scintillator layer may be formed by, for example, bonding a laminated body having a support (not shown) and the scintillator layer 18 provided on the support, and the TFT substrate 16 to each other such that the scintillator layer 18 and the front surface P face each other, as shown in FIG. 3E. As a result, the scintillator layer 18 is formed on the front surface P of the TFT substrate 16.

Here, the laminated body having a support and the scintillator layer 18 may be, for example, a laminated body obtained by forming the scintillator layer 18 on a scintillator layer support (a support for the scintillator layer) by vapor deposition.

The method of disposing the laminated body and the TFT substrate 16 one on another is not particularly limited, as long as the scintillator layer 18 and the thin-film transistor are optically coupled to each other. The method of disposing the laminated body and the TFT substrate 16 may be a method of allowing the laminated body and the TFT substrate 16 to face each other and adhering them so as to have direct and close contact with each other, or a method of tightly adhering the laminated body and the TFT substrate 16 to each other by disposing a resin layer (a bonding layer, a flattening layer, or the like) therebetween.

When adhering the laminated body and the TFT substrate 16 so as to have close contact with each other, the close contact between the surface of the laminated body and the surface of the TFT substrate 16 is not necessarily required over the entire surface. When the surface of the scintillator layer 18 has irregularities due to crystals or when the TFT substrate 16 has irregularities due to the TFT or the photoelectric conversion layer, close contact over the entire surface is not required as long as the laminated body and the TFT substrate 16 are optically coupled to each other—in other words, as long as light converted from radiation by the scintillator layer 18 can be incident on the TFT substrate 16.

A resin layer may be disposed between the scintillator layer 18 and the TFT substrate 16.

Examples of the resin layer that is optionally disposed between the scintillator layer 18 and the TFT substrate 16 include a flattening layer which flattens the surface of the scintillator layer 18, a bonding layer that tightly adheres to and fixes the scintillator layer 18 and the TFT substrate 16, and a matching oil layer formed from a transparent liquid or gel.

The resin that forms the resin layer is not particularly limited as long as scintillation light emitted from the scintillator layer 18 reaches the TFT substrate 16 without being attenuated.

The resin that forms the flattening layer may be, for example, polyimide or parylene; polyimide, which has favorable film forming properties, is preferable.

There is no limitation on the adhesive forming the bonding layer as long as the adhesive is optically transparent to scintillation light emitted from the scintillator layer 18. Examples of the adhesive include thermoplastic resins, UV-curable adhesives, thermosetting adhesives, room-temperature curable adhesives, low-viscosity epoxy resins, and double-sided adhesive sheets.

Of these, use of an adhesive made of low-viscosity epoxy resin is preferable in that a bonding layer having a sufficiently small thickness as compared to the pixel size of the TFT substrate 16 can be formed and a decrease of image sharpness can be prevented.

The configuration of the scintillator layer 18 is not limited to the above-described configuration (the configuration in which the laminated body having a support and the scintillator layer disposed thereon, and the TFT substrate are bonded to each other), and the scintillator layer 18 may be formed directly on the TFT substrate 16 by vapor deposition. In this case, it is not necessary to use a support for the scintillator layer.

The radiographic image detector of this embodiment is produced in the above-described manner.

The method of producing a radiographic image detector according to the first embodiment may include other processes as necessary.

The method of producing a radiographic image detector may further include, for example, a mounting process of mounting a circuit board (for example, a drive IC board) or the like on the TFT substrate 16 (FIG. 3E) after the scintillator layer 18 forming process.

The method of producing a radiographic image detector may further include, as appropriate, processes known in the field of TFT production techniques, such as a cleaning process (a process of performing organic alkali cleaning or pure water cleaning).

Figure 4A:
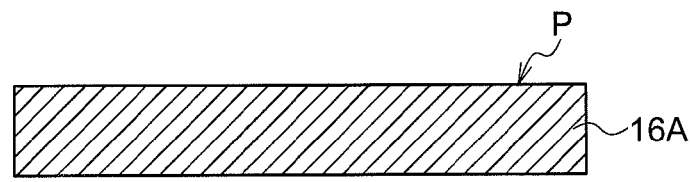
FIGS. 4A to 4F are schematic process views showing a second embodiment of the method of producing a radiographic image detector according to the invention.
Figure 4B:
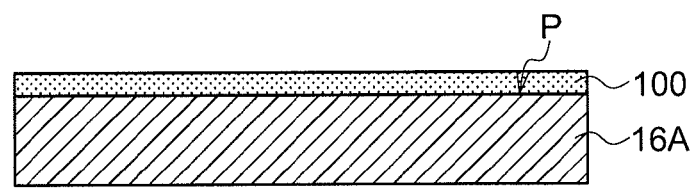
Figure 4C:
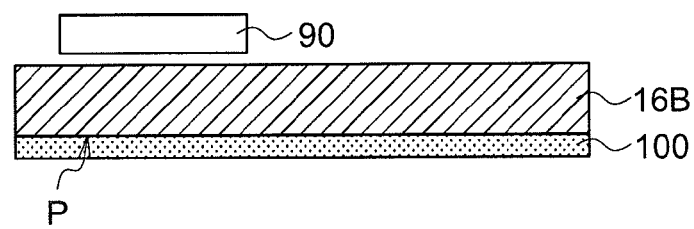
Figure 4D:
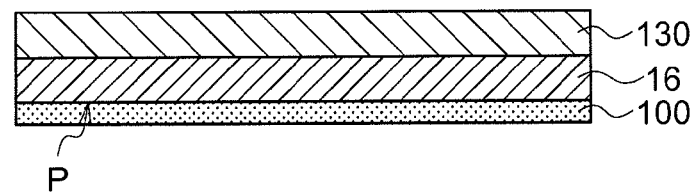

As shown in FIG. 4D, the method of producing a radiographic image detector may further include a support member adhering process of adhering a support member 130 to a surface of the substrate at the polished side, after the polishing process but before the protective member removal process.

FIGS. 4A to 4F are schematic process views showing a second embodiment of the method of producing a radiographic image detector according to the invention.

FIGS. 4A to 4C are diagrams showing the substrate preparation process, the protective member attachment process, and the polishing process, respectively. Since these processes are the same as the respective processes in the first embodiment, descriptions thereof are omitted.

In the support member adhering process in the second embodiment, the support member 130 is adhered to the surface (the rear surface) of the TFT substrate 16 at the polished side, as shown in FIG. 4D.

Figure 4E:
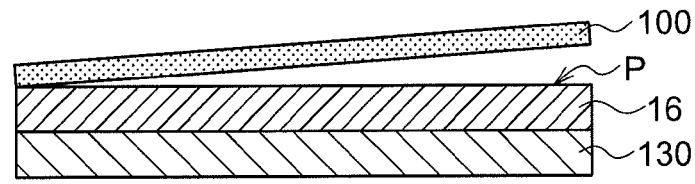

This configuration allows the TFT substrate 16, of which the thickness has been reduced by polishing, to be reinforced. Therefore, damage (such as substrate cracking) to the substrate is more effectively suppressed in the subsequent protective member removal process (FIG. 4E). Thus, this configuration allows further reduction of the substrate thickness by polishing.

The support member 130 may be, for example, a polyethylene naphthalate (PEN) film, a polyethylene terephthalate (PET) film, a polyimide film, a polyethylene (PE) film, a polypropylene (PP) film, or a triacetylcellulose (TAC) film, each of which has a thickness of 0.05 mm to 1 mm.

The support member 130 may be adhered to the rear surface using, for example, any of the adhesives described in the explanation of the scintillator layer forming process.

Figure 4F:
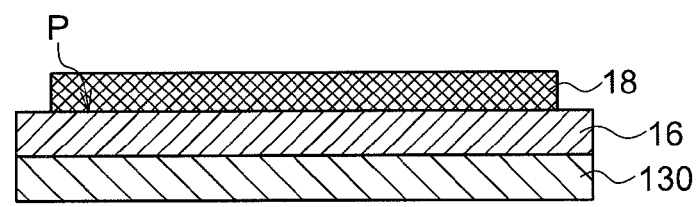

FIGS. 4E and 4F illustrate the protective member removal process and the scintillator layer forming process, respectively. Since these processes are the same as the respective processes in the first embodiment except that the support member 130 is provided on the rear surface of the TFT substrate 16, descriptions thereof are omitted.

EXAMPLES

The invention is specifically described below by reference to examples. However, the specific examples should not be construed as limiting the invention. In the following examples, the term "parts" means "parts by mass".

Example 1

<<Production of Radiographic Image Detector>>

A radiographic image detector was produced according to the first embodiment (FIGS. 3A to 3E) of the method of producing a radiographic image detector.
<Substrate Preparation Process (FIG. 3A)>

A TFT substrate 16A according to the first embodiment was prepared (FIG. 3A).

The TFT substrate 16A had a structure composed of an alkali-free glass substrate (thickness: 0.7 mm) serving as an insulating substrate 12 and switch elements (TFT) 28 and photoelectric conversion layer 26 provided on the alkali-free glass substrate.
<Protective Member Attachment Process (FIG. 3B)>

Next, a protective member 100 as shown in FIG. 5 was prepared.

Specifically, a coating liquid for forming an adhesive layer (the content of carbon particles in the coating liquid being 10% by mass relative to the total solids content) according to the following formulation was coated onto a PET film (thickness 250 μm) serving as a protective member support 110, and dried to form an adhesive layer 120 (layer thickness: 10 μm). In this way, a protective member 100 was obtained.
—Formulation of Coating Liquid for Forming Adhesive Layer—

| | |
|---|---|
| carbon particles (#3050B manufactured by Mitsubishi Chemical Corporation, number average particle diameter: 0.05 μm): | 10 parts |
| adhesive resin (base polymer having a weight-average molecular weight of 700,000 and being a copolymer of 70 parts of ethyl acrylate, 30 parts of butyl acrylate, and 1 part of 2-hydroxyethyl acrylate): | 90 parts |
| organic solvent (toluene): | 500 parts |

Next, the protective member 100 was attached to the TFT substrate 16A by using a laminator under the following lamination conditions, such that the adhesive layer 120 of the protective member 100 and the front surface P of the TFT substrate 16A contacted each other.

—Lamination Conditions—

Lamination was performed using a laminator "LPV6507" manufactured by Fujipla Inc. at a pressure of 0.1 MPa and a rate 1 m/min.
<Polishing Process (FIG. 3C)>

Next, the rear surface of the TFT substrate 16A was polished under the following polishing conditions.

Polishing was carried out until the 10 point-average substrate thickness as determined from the thicknesses at 10 points on the plane became 0.2 mm.
—Polishing Conditions—

| | |
|---|---|
| polishing apparatus: | SGR-700SP manufactured by Shinko MechatroTech Co., Ltd. |
| polishing pad: | unwoven fabric type polishing pad manufactured by FILWEL Co., Ltd. |
| polishing condition: | adjusted so as to set the polishing speed to 0.25 μm/h |
| polishing liquid: | cerium oxide slurry |

<Protective Member Removal Process (FIG. 3D)>

Next, the protective member 100 was separated and removed from the TFT substrate 16 after polishing.
<Scintillator Layer Forming Process (FIG. 3E)>
(Production of Laminated Body Composed of Substrate and Scintillator Layer)

A scintillator layer 18 made of CsI:Tl crystals was formed on an alkali-free glass substrate (0.7 mm in thickness) for liquid crystal serving as a support for a scintillator layer (for example, the scintillator layer support 11 shown in FIG. 1) by vapor deposition in the following manner, as a result of which a laminated body composed of the substrate and the scintillator layer was obtained.

Specifically, Ar plasma surface treatment was carried out on the scintillator layer support in order to improve adhesiveness to a CsI:Tl crystal layer. Thereafter, the surface-treated support was set in a vacuum chamber for forming a scintillator layer. The vacuum chamber had plural melting pots for independently heating CsI and TlI as raw materials. After the air was exhausted from the chamber, a certain amount of Ar was flowed into the chamber, such that the pressure inside the chamber was set to 0.75 Pa. When the raw material melting pots had been heated and the molten state of the raw materials had been stabilized, the support was concentrically rotated by a device mechanism of the vacuum apparatus, and the shutter was opened to start vacuum deposition of a non-columnar crystal region of CsI:Tl crystal.

Film formation was carried out under these conditions, and, when the film thickness of the non-columnar crystal region became 5 μm, the pressure inside the chamber was raised to 1 Pa to start vacuum deposition of a columnar crystal region of CsI:Tl crystal. Considering that the molten state changes with a change in the degree of vacuum, the shutter was closed once, and, after confirming the stabilization of the molten state, the shutter was opened again to restart vacuum deposition. When the film thickness of the columnar crystal region became 500 μm, heating of the raw material melting pots was stopped, and air was introduced into the vacuum apparatus.

Through the above processes, a scintillator layer 18 made of CsI:Tl crystal was formed on the scintillator layer support, thereby forming a laminated body composed of the substrate and the scintillator layer.

The CsI:Tl crystal forming the scintillator layer 18 was configured such that the region of the scintillator layer close to the scintillator layer support was a non-columnar crystal region, and the region of the scintillator layer farther from the scintillator layer support was a columnar crystal region.

(Formation of Scintillator Layer on TFT Substrate)

Next, a low-viscosity epoxy resin adhesive (ARALDITE 2020 (tradename) manufactured by Huntsman Corporation) which had been diluted with a solvent was coated on the front surface P of the TFT substrate 16 using a spin coater such that the thickness of the adhesive coating after the evaporation of the solvent became 15 µm, as a result of which a bonding layer (a bonding layer 25 shown in FIG. 1) was formed.

Next, the bonding layer 25 formed on the TFT substrate 16, and the columnar crystal region of the scintillator layer 18 of the laminated body composed of the substrate and the scintillator layer, were allowed to face each other, and were heated, whereby the TFT substrate 16 and the scintillator layer 18 of the laminated body were bonded to each other with the bonding layer 25 disposed therebetween.

Through the above processes, the scintillator layer 18 was formed on the TFT substrate 16, as a result of which a radiographic image detector (a radiographic image detector 10 shown in FIG. 1) was obtained.

Thereafter, a circuit board for driving a TFT and an integrated circuit (IC) for reading electric charges were adhered to the terminal section of the TFT substrate 16 of the radiographic image detector by using an anisotropic conductive film, and the circuit board for driving a TFT and the integrated circuit (IC) for reading electric charges were further connected to a circuit board for driving control and AD (analog-to-digital) conversion.

In this way, the circuit board for driving control and AD conversion was mounted on the radiographic image detector.

When the radiographic image detector after the mounting was used to read a radiographic image, the radiographic image detector was disposed so as to allow radiation to be incident from the rear side of the TFT substrate 16, and reading was performed while controlling a PC (personal computer) for operation that was connected, by a cable, to the radiographic image detector after the mounting.

<<Measurement and Evaluation>>

The following measurements and evaluations were performed during the process of producing the radiographic image detector, and also on the radiographic image detector produced. The evaluation results are shown in Table 1.

<Delamination Charging>

In the protective member removal process (FIG. 3D), delamination charging (charge amount) and destruction of a semiconductor device (TFT device) were evaluated.

Specifically, the charge amount on the TFT substrate when the protective member was removed at a speed of 10 mm/sec was measured by using an electrostatic tester manufactured by Sumitomo 3M Ltd. The electrostatic destruction of the semiconductor device was observed by an optical microscope.

(Evaluation Criteria)

A: The electrostatic destruction of the semiconductor device was not observed, the charge amount was less than 100 V, and the degree of delamination charging was extremely low.

B: The electrostatic destruction of the semiconductor device was not observed, the charge amount was from 100 V to less than 500 V, and the degree of delamination charging was within a practically tolerable range.

C: The electrostatic destruction of the semiconductor device was observed, the charge amount was 500 V or more, and the degree of delamination charging was at a practically intolerable level.

<Light-Emission Properties of Scintillator Layer>

The light-emission properties of the scintillator layer were evaluated by using the radiographic image detector produced.

Specifically, the sensitivity when X-rays were irradiated at a tube voltage of 120 kV was evaluated, and the light-emission properties of the scintillator layer were evaluated according to the following evaluation criteria.

(Evaluation Criteria)

A: Sensitivity was not decreased compared to the sensitivity before polishing, which indicates excellent light-emission properties of the scintillator layer.

B: A decrease in sensitivity compared to the sensitivity before polishing was less than 10% of the sensitivity before polishing, which indicates light-emission properties of the scintillator layer being within a practically tolerable range.

C: A decrease in sensitivity compared to the sensitivity before polishing was 10% or more, which indicates light-emission properties of the scintillator layer being at a practically intolerable level.

<Unevenness in Substrate Thickness>

Unevenness in the substrate thickness was evaluated after the polishing process (FIG. 3C) but before the protective member removal process (FIG. 3D).

Specifically, the substrate thickness was measured at 100 points in the plane, using a micrometer. Substrate thickness uniformity (%) was calculated based on the maximum value of the substrate thickness, the minimum value of the substrate thickness, and the average value of the substrate thickness, according to the following equation. Unevenness in the substrate thickness was evaluated according to the following evaluation criteria.

$$\text{Substrate thickness uniformity (\%)} = ((\text{the maximum value} - \text{the minimum value})/(\text{the average value} \times 2)) \times 100$$

(Evaluation Criteria)

A: The substrate thickness uniformity in the plane was less than ±5%, which indicates that unevenness in the substrate thickness was extremely small.

B: The substrate thickness uniformity in the plane was from ±5% to less than ±10% (i.e., the absolute value of the substrate thickness uniformity is from 5% to less than 10%), and unevenness in the substrate thickness was within a practically tolerable range.

C: The substrate thickness uniformity was ±10% or more (i.e., the absolute value of the substrate thickness uniformity is 10% or more), and unevenness in the substrate thickness was at a practically intolerable level.

<Image Unevenness>

X-rays (radiation) were incident, from the rear side of the TFT substrate 16, on the radiographic image detector after the mounting, as a result of which an X-ray image was obtained.

The obtained X-ray image was output to an X-ray film (DI-HL manufactured by FUJIFILM Corporation) using a DRY PIX 7000 manufactured by FUJIFILM Corporation, and the output X-ray image was evaluated with respect to image unevenness according to the following evaluation criteria.

Here, image unevenness caused by at least one factor selected from delamination charging, deterioration of light-emission properties, scratch on the TFT, and unevenness in the substrate thickness was evaluated.

(Evaluation Criteria)

A: No image unevenness was visually observed, and image unevenness was extremely low.

B: Slight image unevenness was visually observed, but the image unevenness was within a practically tolerable range.

C: Apparent image unevenness was visually observed, and the image unevenness was at a practically intolerable level.

<Image Sharpness (MTF: Modulation Transfer Function)>

An MTF curve was obtained by calculation from an edge image obtained by imaging an MTF (Modulation Transfer Function) edge made of W (tungsten), according to the IEC (International Electrotechnical Commission) standard. The results were compared by comparing the values obtained at 2 cycle/mm, and evaluation was performed according to the following evaluation criteria based on relative values assuming the value of Example 1 as 100.

(Evaluation Criteria)

A: The relative value was 95 or more, which indicates excellent image sharpness.
B: The relative value was from 90 to less than 95, which indicates image sharpness within a practically tolerable range.
C: The relative value was less than 90, which indicates image sharpness at a practically intolerable level.

Examples 2 and 4 to 7

A radiographic image detector was produced in the same manner as in Example 1, except that the content of carbon particles in the coating liquid for forming an adhesive layer relative to the total solids content of the coating liquid was changed as shown in Table 1, and the same evaluations as the evaluations conducted in Example 1 were carried out.

The evaluation results are shown in Table 1.

Example 3

A radiographic image detector was produced in the same manner as in Example 1, except that the protective member was changed to a protective member for Example 3 prepared as described below, and that the protective member removal process was carried out by subjecting the TFT substrate to heat treatment at 95° C. for five minutes and thereafter detaching and removing the protective member. Then, the same evaluations as the evaluations conducted in Example 1 were carried out.

The evaluation results are shown in Table 1.

—Production of Protective Member for Example 3—

Carbon particles used in Example 1 were scattered on the surface of an adhesive layer of REVALPHA No. 3196 manufactured by Nitto Denko Corporation at the density indicated in Table 1, as a result of which the protective member for Example 3 was obtained.

The adhesive layer contained 20% by mass of thermally-expandable particles (MICROSPHERE-301D having a number average particle diameter of 15 μm (manufactured by Matsumoto Yushi-Seiyaku Co., Ltd.)).

Example 8

A radiographic image detector was produced in the same manner as in Example 1, except that the type of carbon particles in the coating liquid for forming an adhesive layer was changed from #3050B (number average particle diameter 0.05 μm) manufactured by Mitsubishi Chemical Corporation to #3230B (number average particle diameter 0.02 μm) manufactured by Mitsubishi Chemical Corporation. Then, the same evaluations as the evaluations conducted in Example 1 were carried out.

The evaluation results are shown in Table 1.

Example 9

A radiographic image detector was produced in the same manner as in Example 1, except that the carbon particles in the coating liquid for forming an adhesive layer were changed to copper particles (copper powder manufactured by Aldrich Co. having a diameter of 0.1 μm). Then, the same evaluations as the evaluations conducted in Example 1 were carried out.

The evaluation results are shown in Table 1.

Example 10

A radiographic image detector was produced in the same manner as in Example 1, except that the carbon particles in the coating liquid for forming an adhesive layer were changed to copper particles (copper powder manufactured by Aldrich Co. having a diameter of 3 μm). Then, the same evaluations as the evaluations conducted in Example 1 were carried out.

The evaluation results are shown in Table 1.

Example 11

A radiographic image detector was produced in the same manner as in Example 1, except that the carbon particles in the coating liquid for forming an adhesive layer were changed to copper particles (D50 manufactured by SCM Metal Products, Inc. having a diameter of 11 μm). Then, the same evaluations as the evaluations conducted in Example 1 were carried out.

The evaluation results are shown in Table 1.

Example 12

A radiographic image detector was produced in the same manner as in Example 1, except that the carbon particles in the coating liquid for forming an adhesive layer were changed to copper particles (D50 manufactured by SCM Metal Products, Inc. having a diameter of 32 μm). Then, the same evaluations as the evaluations conducted in Example 1 were carried out.

The evaluation results are shown in Table 1.

Example 13

A radiographic image detector was produced in the same manner as in Example 1, except that the CsI:Tl crystal forming the scintillator layer was changed to a $Gd_2O_2S$:Tb crystal (GOS crystal). Then, the same evaluations as the evaluations conducted in Example 1 were carried out.

The evaluation results are shown in Table 1.

Specifically, a fluorescent material sheet produced as described below was adhered to the TFT substrate by the same method as the method employed in Example 1, thereby producing a radiographic image detector.

—Production of Fluorescent Material Sheet—

20% by weight of a mixture of polyvinyl butyral resin, urethane resin, and a plasticizer was dissolved in 80% by weight of a mixed solvent of toluene, 2-butanol, and xylene, followed by sufficient stirring, as a result of which a binder was obtained.

The binder and a $Gd_2O_2S$:Tb fluorescent material having an average particle diameter of 5 μm were mixed at a weight ratio of 15:85 (%), and the resultant mixture was subjected to dispersing treatment using a ball mill, as a result of which a fluorescent material coating liquid was prepared.

The fluorescent material coating liquid was coated on a surface of a polyethylene terephthalate sheet (temporary support having a thickness of 190 μm), on which a silicone-based release agent had been coated, at a width of 300 mm by using a doctor blade. The coating was dried, and then separated from the temporary support, as a result of which a fluorescent material sheet (thickness: 200 μm) was obtained.

Comparative Example 1

A radiographic image detector was produced in the same manner as in Example 1, except that the protective member was not used, and that the rear surface of the TFT substrate was polished before being adhered to the scintillator layer. Then, the same evaluations as the evaluations conducted in Example 1 were carried out.

The evaluation results are shown in Table 1.

Comparative Example 2

A radiographic image detector was produced in the same manner as in Example 1, except that the process sequence was changed so as to perform the polishing of the rear surface of the TFT substrate after the adhering of the scintillator layer to the TFT substrate. Then, the same evaluations as the evaluations conducted in Example 1 were carried out.

The evaluation results are shown in Table 1.

Comparative Example 3

A radiographic image detector was produced in the same manner as in Example 13, except that the process sequence was changed so as to perform the polishing of the rear surface of the TFT substrate after the adhering of the scintillator layer to the TFT substrate. Then, the same evaluations as the evaluations conducted in Example 1 were carried out.

The evaluation results are shown in Table 1.

Comparative Example 4

A radiographic image detector was produced in the same manner as in Example 1, except that the carbon particles were not contained in the coating liquid for forming an adhesive layer. Then, the same evaluations as the evaluations conducted in Example 1 were carried out.

The evaluation results are shown in Table 1.

TABLE 1

| | | | Configuration of Protective Member | | | | | |
| | | Presence/ Absence of Protective Member | | Conductive Particles | | | | Thermally-expandable Particles |
| | Polishing Process | | Type | Particle diameter ($\mu$m) | Presence Position | Content (% by mass) | Density (particles/ $mm^2$) | |
| --- | --- | --- | --- | --- | --- | --- | --- | --- |
| Example 1 | Before scintillator (CsI) is adhered | Present | Carbon particles | 0.05 | Inside of layer | 10 | — | Absent |
| Example 2 | Before scintillator (CsI) is adhered | Present | Carbon particles | 0.05 | Inside of layer | 20 | — | Absent |
| Example 3 | Before scintillator (CsI) is adhered | Present | Carbon particles | 0.05 | On layer surface | — | 500 | Present |
| Example 4 | Before scintillator (CsI) is adhered | Present | Carbon particles | 0.05 | Inside of layer | 30 | — | Absent |
| Example 5 | Before scintillator (CsI) is adhered | Present | Carbon particles | 0.05 | Inside of layer | 5 | — | Absent |
| Example 6 | Before scintillator (CsI) is adhered | Present | Carbon particles | 0.05 | Inside of layer | 1 | — | Absent |
| Example 7 | Before scintillator (CsI) is adhered | Present | Carbon particles | 0.05 | Inside of layer | 0.5 | — | Absent |
| Example 8 | Before scintillator (CsI) is adhered | Present | Carbon particles | 0.02 | Inside of layer | 10 | — | Absent |
| Example 9 | Before scintillator (CsI) is adhered | Present | Copper particles | 0.1 | Inside of layer | 10 | — | Absent |
| Example 10 | Before scintillator (CsI) is adhered | Present | Copper particles | 3 | Inside of layer | 10 | — | Absent |
| Example 11 | Before scintillator (CsI) is adhered | Present | Copper particles | 11 | Inside of layer | 10 | — | Absent |
| Example 12 | Before scintillator (CsI) is adhered | Present | Copper particles | 32 | Inside of layer | 10 | — | Absent |
| Example 13 | Before scintillator (GOS) is adhered | Present | Carbon particles | 0.05 | Inside of layer | 10 | — | Absent |
| Comparative Example 1 | Before scintillator (CsI) is adhered | Absent | — | — | — | — | — | — |
| Comparative Example 2 | After scintillator (CsI) is adhered | Absent | — | — | — | — | — | — |

TABLE 1-continued

| | | | | | | | |
|---|---|---|---|---|---|---|---|
| Comparative Example 3 | After scintillator (GOS) is adhered | Absent | — | — | — | — | — |
| Comparative Example 4 | Before scintillator (CsI) is adhered | Present | | No conductive particles | | | Absent |

| | Evaluation Results | | | | |
|---|---|---|---|---|---|
| | Delamination Charging | Light-Emission Property | Unevenness in Substrate Thickness | Image Unevenness | Image Sharpness |
| Example 1 | A | A | A | A | A |
| Example 2 | A | A | A | A | A |
| Example 3 | A | A | A | A | A |
| Example 4 | A | A | A | A | A |
| Example 5 | A | A | A | A | A |
| Example 6 | B | A | A | A | A |
| Example 7 | B | A | A | A | A |
| Example 8 | A | A | A | A | A |
| Example 9 | A | A | A | A | A |
| Example 10 | A | A | A | A | A |
| Example 11 | A | A | B | A | A |
| Example 12 | A | A | B | A | A |
| Example 13 | A | A | A | A | A |
| Comparative Example 1 | — | B | A | C | A |
| Comparative Example 2 | — | C | C | C | C |
| Comparative Example 3 | — | C | C | C | B |
| Comparative Example 4 | C | A | A | C | A |

As shown in Table 1, delamination charging, deterioration of light-emission properties, and unevenness in the substrate thickness were suppressed in Examples 1 to 13, in which the TFT substrate was polished before the scintillator was adhered, the front surface of the TFT substrate was protected by the attached protective member during polishing of the TFT substrate, and conductive particles were contained in the adhesive layer of the protective member. Further, in Examples 1 to 13, image unevenness due to delamination charging, deterioration in the light-emission properties, scratch on the TFT, or unevenness in the substrate thickness was suppressed, and decrease in MTF was also suppressed.

In Examples 1 to 13, the adhesion force (unit: N/25 mm) of the protective member was measured using a 90° peel tester, and found to be the following: 2.2 (Example 1); 2.4 (Example 2); equal to or smaller than a lower measurement limit (0.1) (Example 3); 1.2 (Example 4); 2.6 (Example 5); 3.0 (Example 6); 3.2 (Example 7); 2.2 (Example 8); 2.1 (Example 9); 1.8 (Example 10); 1.5 (Example 11); 1.0 (Example 12); and 3.0 (Example 13). The adhesion force was especially small in Example 3, in which thermally-expandable particles were contained.

In the embodiments represented by Examples 1 to 13, a support member, such as polyethylene terephthalate, may be adhered to a surface of the thin-film transistor substrate at the polished side after the polishing process but before the protective member removal process. The adhesion of the support member enables the substrate to maintain higher strength when the protective member is detached, and makes it possible to further reduce the substrate thickness while suppressing substrate cracking.

In contrast, in Comparative Example 1 in which the front surface of the TFT substrate was not protected by the protective member during polishing of the TFT substrate, the TFT was scratched due to the polishing, and image unevenness was generated as a result of the scratch on the TFT.

In Comparative Examples 2 and 3 in which the TFT substrate was polished after the TFT substrate was adhered to the scintillator, deterioration in the light-emission properties of the scintillator and unevenness in the substrate thickness were observed, and image unevenness due to deterioration of the light-emission properties and unevenness in the substrate thickness was also observed. A decrease in image sharpness (MTF) was also observed. The decrease in image sharpness (MTF) was noticeable particularly in Comparative Example 2 in which CsI:Tl was used as the scintillator. The noticeable decrease in image sharpness (MTF) in Comparative Example 2 is supposed to result from the deliquescence or dissolution of the columnar crystals of CsI:Tl due to the polishing liquid.

In Comparative Example 4 in which conductive particles were contained in the adhesive layer of the protective member, delamination charging occurred at the TFT substrate, and image unevenness was generated which is supposed to result from the delamination charging (damage to the TFT).

According to the invention, a method of producing a radiographic image detector capable of suppressing deterioration of the thin-film transistor due to delamination charging when the protective member is released, capable of suppressing deterioration in the light-emission properties of the scintillator, and capable of suppressing unevenness in the substrate thickness after polishing can be provided, and a protective member for use in the production method can be also provided.

According to the invention, a radiographic image detector with which image unevenness is suppressed and decrease in image sharpness due to deterioration of the thin-film transistor or the scintillator or due to unevenness in the substrate thickness is also suppressed, can be provided.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of producing a radiographic image detector, the method comprising:
    preparing a thin-film transistor substrate comprising an insulating substrate and a thin-film transistor that is disposed on a surface of the insulating substrate at a first side;
    attaching, to the thin-film transistor substrate, a protective member comprising a protective member support and an adhesive layer that includes conductive particles and that is disposed on the protective member support, such that the adhesive layer and a surface of the thin-film transistor substrate at the first side contact each other;
    polishing a surface of the thin-film transistor substrate at a second side opposite to the first side, after the attaching of the protective member;
    separating and removing the protective member from the thin-film transistor substrate after the polishing; and
    providing a scintillator layer on a surface of the thin-film transistor substrate at the first side, after the removing of the protective member,
    wherein the content of the conductive particles in the adhesive layer is from 0.1% by mass to 40% by mass relative to the total mass of the adhesive layer.

2. The method of producing a radiographic image detector according to claim 1, wherein the conductive particles are carbon particles.

3. The method of producing a radiographic image detector according to claim 1, wherein the number average particle diameter of the conductive particles is from 0.01 µm to 50 µm.

4. The method of producing a radiographic image detector according to claim 1, wherein the adhesive layer further comprises thermally-expandable particles.

5. The method of producing a radiographic image detector according to claim 1, further comprising adhering a support member to a surface of the thin-film transistor substrate at the second side, after the polishing but before the removing of the protective member.

6. The method of producing a radiographic image detector according to claim 1, wherein the scintillator layer comprises a crystal including CsI, or a crystal including $Gd_2O_2S$ and Tb.

7. The method of producing a radiographic image detector according to claim 1, wherein the conductive particles are contained inside the adhesive layer.

8. A radiographic image detector which is produced by the method of producing a radiographic image detector according to claim 1, wherein the radiographic image detector detects a radiographic image by allowing a radiation to be incident from the second side of the thin-film transistor substrate.

* * * * *